United States Patent [19]

Pouet et al.

[11] Patent Number: 5,601,226

[45] Date of Patent: *Feb. 11, 1997

[54] DEVICE FOR ASSEMBLING SEMICONDUCTOR CHIPS BETWEEN TWO HEAT SINKS

[75] Inventors: Claude Pouet, Tours; Yoland Collumeau, Rochecorbon, both of France

[73] Assignee: SGS-Thomson Microelectronics S.A., Saint Genis Pouilly, France

[*] Notice: The term of this patent shall not extend beyond the expiration date of Pat. No. 5,351,873.

[21] Appl. No.: 481,891

[22] Filed: Jun. 7, 1995

Related U.S. Application Data

[62] Division of Ser. No. 289,947, Aug. 12, 1994, Pat. No. 5,462,219, which is a continuation of Ser. No. 82,668, Jun. 25, 1993, Pat. No. 5,351,873.

[30] Foreign Application Priority Data

Jun. 26, 1992 [FR] France .................. 92 08282

[51] Int. Cl.⁶ .................. B23K 31/02; B23K 37/04
[52] U.S. Cl. .................. 228/123.1; 228/212; 437/902
[58] Field of Search .................. 228/49.1, 49.5, 228/123.1, 212; 29/740, 760; 437/902

[56] References Cited

U.S. PATENT DOCUMENTS 2,964,431  12/1960  Kalish et al. .................. 437/902
4,868,974   9/1989  Masanori .................. 29/740
4,956,911   9/1990  Zaremba et al. .................. 228/49.1
5,351,873  10/1994  Pouet et al. .................. 228/49.1
5,462,219  10/1995  Pouet et al. .................. 228/49.5

FOREIGN PATENT DOCUMENTS 0306957  9/1988  European Pat. Off. .
0329004  8/1989  European Pat. Off. .................. 29/740
1258668  9/1986  U.S.S.R. .................. 228/49.1

OTHER PUBLICATIONS

"Lead–Bonding Placement Apparatus," *IBM Tech. Discl. Bull.*, vol. 28, No. 10 (Mar. 1986) 4337–8.

French Search Report from French Patent Application No. 92 08282, filed Jun. 26, 1992.

*Primary Examiner*—P. Austin Bradley
*Assistant Examiner*—Jeffrey T. Knapp
*Attorney, Agent, or Firm*—David M. Driscoll; James H. Morris

[57] ABSTRACT

A device for mounting chips between two flat heat sinks includes a base provided with an assembly of ramps disposed in a saw-tooth pattern; a plurality of main stops aligned at the bottom of the ramps and open in a direction toward the top of the ramps; and, for each main stop, a median stop protruding from the main stop and dividing it into two sub-stops, each sub-vee for receiving a heat sink disposed in parallel with the associated ramp, the median stop being designed to accommodate a chip.

9 Claims, 2 Drawing Sheets

1

DEVICE FOR ASSEMBLING SEMICONDUCTOR CHIPS BETWEEN TWO HEAT SINKS

This application is a division of application Ser. No. 08/289,947, filed Aug. 12, 1994, now U.S. Pat. No. 5,462, 219 which in turn is a continuation of application Ser. No. 08/082,668, filed Jun. 25, 1993 now U.S. Pat. No. 5,351,873.

BACKGROUND OF THE INVENTION

1. Field of the Invention

The present invention relates to power electronic components, and more particularly to semiconductor chips soldered between two flat heat sinks, generally copper disks.

2. Discussion of the Related Art

FIG. 1 is a partial cross-sectional view of a device for mounting a chip between two disk-shaped heat sinks. The device 10 includes cylindric cavities 12 (one of which is shown) in which are successively introduced a first copper disk 14, a chip 15 (generally square-shaped), and a second disk 16. The diameters of disks 14 and 16 are larger than a diagonal length of chip 15. Chip 15 is shown as viewed laterally along a diagonal length.

Elements 14–16 are interconnected by means of solder 18 initially deposited on both sides of chip 15 and/or on one surface of the disks. One can also use solder preforms between each face of the chip and the corresponding disk.

The diameter of cavity 12 is slightly larger than the diameter of disks 14 and 16 providing easy insertion and removal of the sandwich formed by elements 14–16. Thus, in most cases, as represented, elements 14–16 are disposed in a stepped position and a corner of chip 15 (the right corner in FIG. 1) can protrude from one of the heat sinks and be further subject to shocks capable of damaging it. Additionally, in order to melt solder 18, the device 10, provided with sandwiched elements, is introduced into an oven by a conveyor. If elements 14–16 happen to be initially suitably aligned, the vibrations of the conveyor tend to misalign them, this shifting being increased by the molten solder An object of the invention is to provide a device for positioning two heat sinks with respect to a chip so as to prevent a corner of the chip from protruding from the heat sinks.

Another object of the invention is to provide such a device on which the chips and heat sinks can easily be disposed.

A further object of the invention is to provide such a device allowing the use of square-shaped heat sinks.

Those objects are achieved by using, instead of the above-mentioned cavities, stops in which the sandwiched elements are positioned due to gravity, an adequately sized stop portion being combined with each element of the sandwich.

In conventional systems, it is not possible to position the elements by using gravity, for example, by tilting device 10, because two corners of the chips are then positioned flush with the edge of the heat sinks and are not protected from shocks. According to the invention, by suitably disposing the stop portions respectively associated with the elements of the sandwich, the corners of the chip will always be set back with respect to the edges of the heat sinks.

SUMMARY OF THE INVENTION

The invention is more particularly directed to a device for mounting chips between two flat heat sinks, including: a base provided with an assembly of ramps disposed in a saw-tooth pattern; a plurality of main stops, aligned at the bottom of the ramps and open in direction to the top of the ramps; and for each main stop, a median stop protruding from the main stop and dividing it into two sub-stops, each useful for receiving a heat sink disposed in parallel with the associated ramp, the median stop being provided to accommodate a chip.

According to an embodiment of the invention, stops are formed in metal rules parallel to the ramps. Each rule includes a guiding projection portion disposed in a groove provided in the bottom of an associated ramp.

According to an embodiment of the invention, the rules are fixed to the base by means of screws that pass through the base and are screwed in the rules.

According to an embodiment of the invention, the bottoms of the stop are provided with recesses formed by piercing.

The foregoing and other objects, features, aspects and advantages of the invention will become apparent from the following detailed description of the present invention when taken in conjunction with the accompanying drawings.

BRIEF DESCRIPTION OF DRAWINGS

FIGS. 2A–2C are simultaneously described, the various views being useful for understanding the design of the device according to the invention.

DETAILED DESCRIPTION

Figure 1:
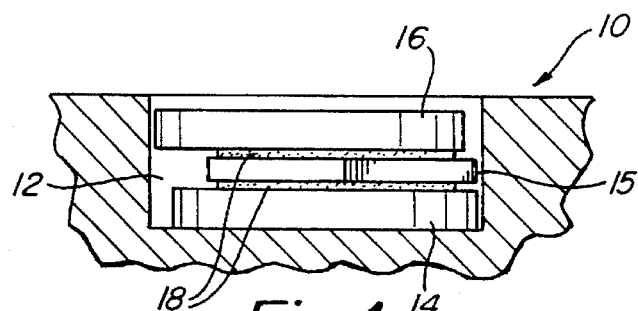
FIG. 1, above described, is a partial cross-sectional view of a conventional device for mounting a chip between two heat sinks.

According to the embodiment of the invention, the device includes a horizontal base 20, generally rectangular in shape, provided on its upper side with an assembly of tilted ramps 22 disposed in a saw-tooth pattern, that is, the ramps are parallel with one another, and the end or top of one ramp, is coupled to the initial portion or bottom of the adjacent ramp by a descending step. In the bottom of each ramp is disposed a rule 24 parallel to the ramp. Each rule 24 is provided with successive stops 26. The walls forming such stop are perpendicular to one another and to the ramp. The stops are open towards the top of the ramp, that is, the intersection of the stop walls is on the side of the ramp bottom. As used herein, the term "stop" includes a cutout, preferably a vee-shaped cutout as disclosed, for receiving a disk or chip, and includes two surfaces for respectively contacting at least two adjacent surfaces of the received disk or chip and supporting the disk or chip in a stationary position. While the disclosed stop is preferably vee-shaped, it is envisioned that the stop may be other shapes suitable of supporting a disk or chip as defined, such as, but not limited to, a V-shape.

Each stop 26 is divided into two sub-stops by a median stop 28 protruding from approximately the central portion of stop 26. The thickness of the lower sub-stop is substantially equal to the thickness of the heat sinks; the thickness of the median stop 28 is slightly smaller than the thickness of the chip; the thickness of the upper sub-stop is arbitrary.

Figure 2A:
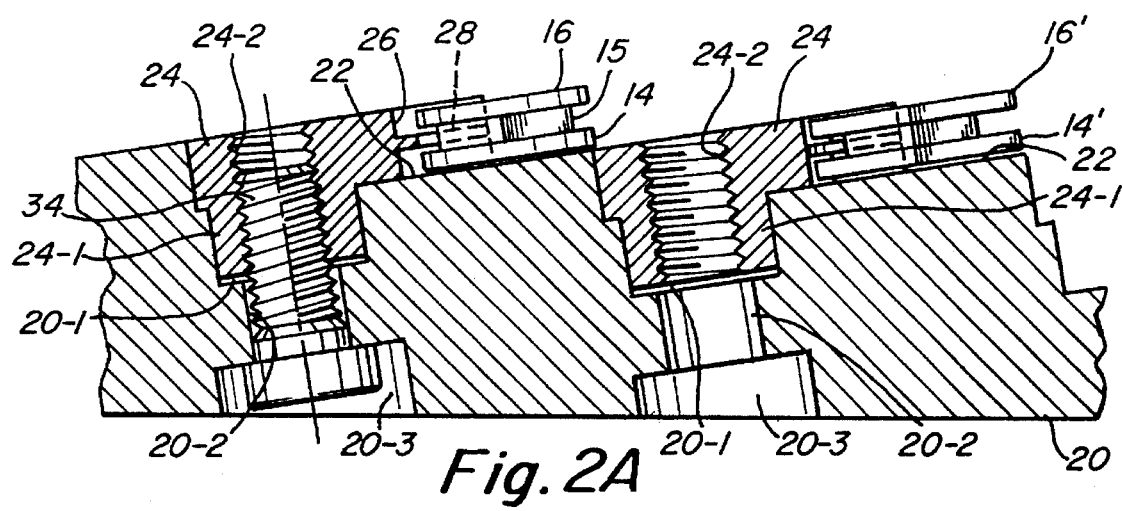
FIGS. 2A and 2B are a partial cross-sectional view and a top view, respectively, of an embodiment of a mounting device according to the invention.
Figure 2B:
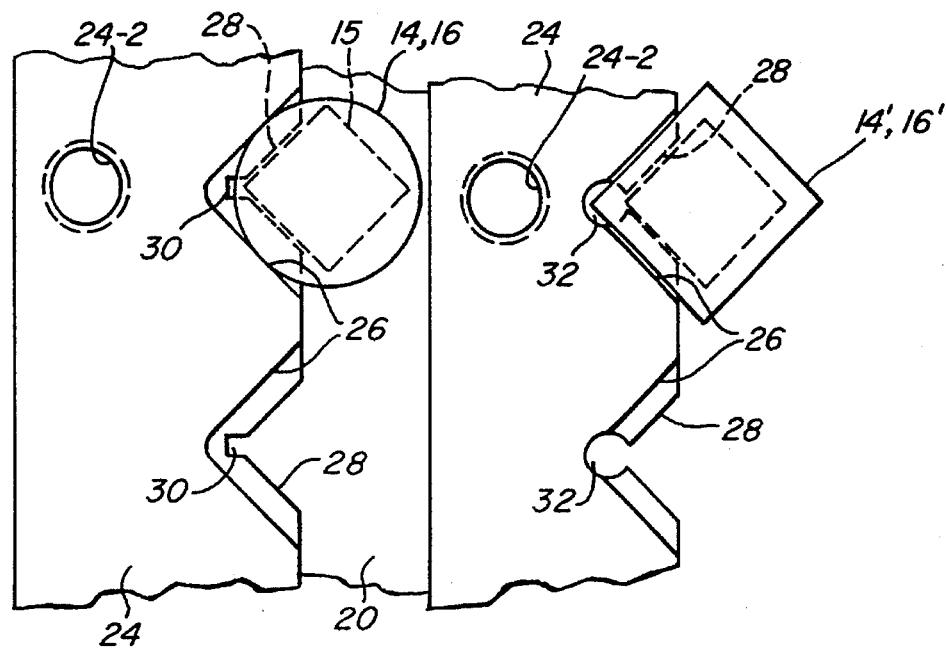

FIGS. 2A and 2B schematically show two sandwiches, each including a chip 15 sandwiched between two heat sinks 14 and 16. A first heat sink, 14, of each sandwich lies on a ramp 22 and abuts against a stop 26, beneath the corresponding median stop 28. Chip 15 lies on the heat sink 14 and abuts against the median stop 28. The second heat sink 16 lies on chip 15 and abuts against stop 26 above the median stop 28. Thus, by suitably selecting the relative positions of the walls of stops 26 and 28 as a function of the sizes of elements 14–16, chip 15 is suitably positioned with respect to heat sinks 14 and 16; so, the chip corners are set back with respect to the edges of the heat sinks. Of course, two adjacent stops 26 are positioned sufficiently apart from one another so that the two adjacent heat sinks disposed in those stops do not contact each other.

A mounting device according to the invention, like the conventional mounting devices (shown in FIG. 1), is provided for batch processing. The mounting device includes, for example, 12 rules 24, each including 22 stops. Elements 14–16 are positioned in the stops by means of a conventional device, such as the device used to position elements in cavities 12 of FIG. 1. Vacuum operating devices are commonly used; they maintain in a predetermined position, all elements (14, 15 or 16) to be disposed in one step on a mounting device. Preferably, the first heat sinks 14 are placed on ramps 22 in front of the corresponding stops 26, slightly apart from the stops, so that their positioning is not impaired by stops 28. Heat sinks 14 then slide along ramps 22 due to gravity into their corresponding substops 26. The sliding operation can be facilitated by applying vibrations during the mounting step. Chips 15 are then disposed on heat sinks 14, also disposed slightly apart from the corresponding stops 28 so that the square-shaped chips are laid upon heat sinks 14 with a given orientation uncertainty. Indeed, a chip 15 may happen to be oriented in such a way that one of its corners contacts an abutment side of the median stop 28. In that case, chip 15 is suitably positioned, that is, in such a way that one of its corners is accommodated in the bottom of stop 28, due to the vibrations that will be applied to the unit. The second heat sinks 16 are then laid upon chips 15, also disposed slightly apart from the corresponding sub-stops 26.

Using stops to position heat sinks allows the use of square-shaped heat sinks 14', as represented in FIG. 2B. The use of square-shaped heat sinks offers the advantage that, during the manufacturing steps, less material (in the present case, copper) is wasted compared with the fabrication of disk-shaped heat sinks. A further advantage of the use of square-shaped heat sinks is that one obtains a relative angular orientation of the heat sinks and of the chip, thus allowing the provision of localized contact portions between the chip and the heat sinks. It is sufficient that the side of the heat sink contacting the chip has protruding regions that are the only regions to be soldered on the chip. To the contrary, with disk-shaped heat sinks; it is not possible to select the angular positioning of the heat sinks with respect to the chip.

The use of square-shaped heat sinks was not conventionally conceivable because cavities 12 (FIG. 1 ) are generally cylindrical (a square cavity being very difficult to form), which does not allow for the orientation of square-shaped heat sinks with respect to one another and to the chip. Even if the fabrication of square cavities was possible, a risk is that at least one corner of the chip would be positioned flush with one edge of the heat sink, which would expose this corner to shocks.

Figure 2C:
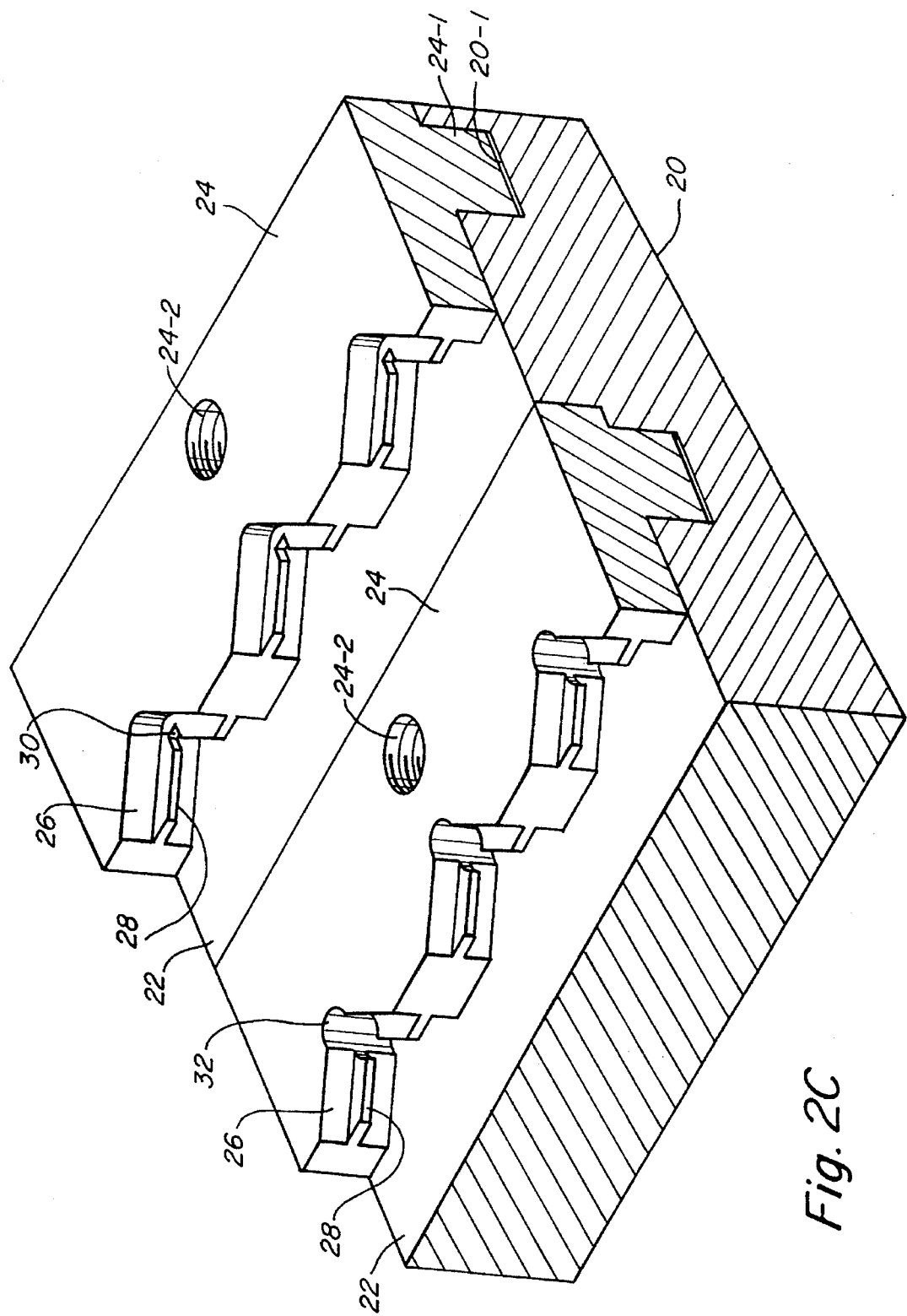
FIG. 2C is a perspective view of the device of FIGS. 2A and 2B.

In order to provide suitable positioning of a square part in a stop (that is, two sides of the square part abutting against the stop walls), a recess in the bottom of the stop is provided for the corners of the element. As shown in FIG. 2B, each sub-stop 28 of the rule 24 (on the left side of FIG. 2C) includes in its bottom a recessed groove 30. If square heat sinks are to be used, stops 26 are also provided with such recesses. According to an embodiment of the invention, as shown in rule 24 (on the right side of FIG. 2B), the rule includes apertures 32 in which the walls of stops 26 and 28 end.

Additionally, each rule 24 includes a perpendicular extension 24-1 disposed in a groove 20-1 of base 20. Groove 20-1 is disposed perpendicularly to ramps 22 and is positioned at their bottom. The object of such mounting is to ensure the rigidity of the assembly and to prevent the rule from being deformed over time. Each rule 24 includes a sufficient number (for example three) of female threads 24-2 crossing extensions 24-1. Threads 24-2 allow for fixing the rules to the base 20 by means of screws passing through apertures 20-2 of base 20. The screw heads are buried and abut against the upper walls of bores 20-3 provided in the bottom of base 20. Threads 24-2, apertures 20-2 and bores 20-3 are parallel to the axis of grooves 20-1.

As is apparent to those skilled in the art, various variants and modifications can be made to the above disclosed preferred embodiments, and in particular to the fixation of rules on base 20.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A method for soldering a heat sink to a chip, the method comprising the steps of:

A. providing an inclined surface and a stop located thereon;

B. positioning the chip and the heat sink adjacent one another on the inclined surface, so that the stop holds the chip and the heat sink in a predetermined configuration relative to one another against the force of gravity, and placing solder adjacent both the chip and the heat sink;

C. melting the solder; and

D. cooling the solder to bond the heat sink and the chip together in the predetermined configuration.

2. The method as recited in claim 1, wherein step A includes forming the stop to include a main stop to abut the heat sink and a median stop to abut the chip.

3. The method as recited in claim 1, wherein step B includes vibrating the chip and the heat sink into the predetermined configuration.

4. The method as recited in claim 1, wherein step B includes placing the chip and heat sink on the inclined surface and sliding the chip and the heat sink into the predetermined configuration.

5. The method as recited in claim 4, wherein step B further includes vibrating the chip and the heat sink into the predetermined configuration.

6. A method for soldering a heat sink to a chip, the method comprising the steps of:

A. providing a device having a main stop and a median stop adjacent the main stop;

B. positioning the chip and the heat sink adjacent one another on the device with the chip abutting the median stop and the heat sink abutting the main stop, so that the stops align the chip and the heat sink in a predetermined configuration relative to one another, and placing solder adjacent both the chip and the heat sink;

C. melting the solder; and

D. cooling the solder to bond the heat sink and the chip together in the predetermined configuration.

7. The method as recited in claim 6, wherein step A includes placing the chip and heat sink on the device and vibrating the chip and heat sink into the predetermined configuration.

8. The method as recited in claim 6, wherein step A includes forming the device with an inclined surface.

9. The method as recited in claim 8, wherein step B includes placing the chip and heat sink on the inclined surface and sliding the chip and heat sink into the predetermined configuration.

* * * * *